(12) United States Patent
Guo et al.

(10) Patent No.: US 10,103,511 B2
(45) Date of Patent: Oct. 16, 2018

(54) LASER BEAM COMBINATION APPARATUS

(71) Applicant: BWT Beijing Ltd., Beijing (CN)

(72) Inventors: Weirong Guo, Beijing (CN); Baohua Wang, Beijing (CN); Zhijie Guo, Beijing (CN); Dan Xu, Beijing (CN); Lei Xu, Beijing (CN); Xiaohua Chen, Beijing (CN)

(73) Assignee: BWT Beijing Ltd., Beijing (CN)

( * ) Notice: Subject to any disclaimer, the term of this patent is extended or adjusted under 35 U.S.C. 154(b) by 22 days.

(21) Appl. No.: 15/501,772

(22) PCT Filed: Apr. 21, 2016

(86) PCT No.: PCT/CN2016/079808
§ 371 (c)(1),
(2) Date: Feb. 3, 2017

(87) PCT Pub. No.: WO2017/173674
PCT Pub. Date: Oct. 12, 2017

(65) Prior Publication Data
US 2018/0212401 A1 Jul. 26, 2018

(30) Foreign Application Priority Data

Apr. 5, 2016 (CN) .......................... 2016 1 0206338

(51) Int. Cl.
*H01S 5/024* (2006.01)
*H02K 3/24* (2006.01)
(Continued)

(52) U.S. Cl.
CPC ........ *H01S 5/02423* (2013.01); *H01S 3/0407* (2013.01); *H01S 3/10053* (2013.01);
(Continued)

(58) Field of Classification Search
CPC ............. H01S 5/02256; H01S 3/10053; H01S 5/02423
(Continued)

(56) References Cited

U.S. PATENT DOCUMENTS 4,986,634 A 1/1991 Horikawa
5,828,683 A 10/1998 Freitas
(Continued)

FOREIGN PATENT DOCUMENTS

CN 103904554 A 7/2014

OTHER PUBLICATIONS

International Search Report (ISR) and Written Opinion dated Jan. 12, 2017 for corresponding PCT/CN2016/079808 including English translation of ISR, 7 pages.

*Primary Examiner* — Tuan Nguyen
(74) *Attorney, Agent, or Firm* — Arch & Lake LLP

(57) ABSTRACT

The present invention discloses a laser beam combination apparatus, comprising: a water cooling plate, a beam combiner and two laser arrays; each of the laser arrays comprises N lasers, wherein N is a positive integer more than 1; the two laser arrays are fixed on an upper surface and a lower surface of the water cooling plate, respectively; and the beam combiner performs a spatial beam combination, a polarization beam combination or a wavelength beam combination of laser beams output from the two laser arrays. Thus it can be seen that in the technical solution provided by the present invention, arrays of lasers are arranged on the upper and lower surfaces of the water cooling plate, and under the condition that a beam combination is performed on the same number of laser light beams, the water cooling plate is used in a high efficiency to decrease the volume and weight of the laser light beam combination apparatus, save the material of the water cooling plate of the laser light beam combination
(Continued)

apparatus, and reduce the cost of the laser light beam combination apparatus, thus meeting the production and processing requirement of the laser light beam combination apparatus, and promoting the continuous development and progress of the laser light beam combination technique.

10 Claims, 8 Drawing Sheets

(51) Int. Cl.
    *H01S 5/40*     (2006.01)
    *H01S 3/04*     (2006.01)
    *H01S 3/10*     (2006.01)
    *H01S 3/23*     (2006.01)
    *H01S 5/022*     (2006.01)

(52) U.S. Cl.
    CPC ........ *H01S 3/10061* (2013.01); *H01S 3/2383* (2013.01); *H01S 5/024* (2013.01); *H01S 5/02256* (2013.01); *H01S 5/4012* (2013.01); *H01S 5/4025* (2013.01); *H01S 5/4087* (2013.01)

(58) Field of Classification Search
    USPC .............. 372/35, 350.121, 50.12, 64, 63, 34
    See application file for complete search history.

(56) References Cited

U.S. PATENT DOCUMENTS

| | | | |
|---|---|---|---|
| 9,054,481 B2 | 6/2015 | Asano | |
| 9,746,627 B2* | 8/2017 | Ishige | G02B 6/4206 |
| 9,835,296 B2* | 12/2017 | Goutain | F21V 9/30 |
| 2008/0247432 A1* | 10/2008 | Miyajima | H01S 5/024 |
| | | | 372/35 |

* cited by examiner

LASER BEAM COMBINATION APPARATUS

CROSS-REFERENCE TO RELATED APPLICATIONS

This application is a National Stage of International Application No. PCT/CN2016/079808, filed on Apr. 21, 2016, which is based upon and claims priority to Chinese Patent Application No. 201610206338.1, filed on Apr. 5, 2016, the entire contents of both of which are incorporated herein by reference.

FIELD OF THE INVENTION

The present invention relates to the technical field of laser, and particularly, to a laser beam combination apparatus.

BACKGROUND OF THE INVENTION

The laser beam combination technique is a procedure for improving beam quality, increasing output power, and raising power density. The common laser beam combination methods include spatial beam combination, polarization beam combination and wavelength beam combination, and their application scenarios are as follows.

A diode laser emitter has the advantages of high efficiency, compact structure, low cost and high reliability. But the output power of a single diode laser emitter is low, and a higher power is obtained by combining the laser beams from a plurality of diode laser emitters. FIG. 1 illustrates a schematic view of a laser beam combination apparatus in the prior art. As illustrated in FIG. 1, three diode laser emitters 2 are placed on different steps of a water cooling plate 1, respectively, and the laser beam emitted from each diode laser 2 is output after being collimated by a fast axis collimation lens 3. In the solution, the diode laser emitters are only arranged on one side of the water cooling plate, so the space is not sufficiently utilized, and the number of lasers available for the laser beam combination is limited. As a result, the power obtained after the laser beam combination is limited.

SUMMARY OF THE INVENTION

In view of the above problem, the present invention is proposed to provide a laser beam combination apparatus, for solving or at least partially solving the above problem.

According to an aspect of the present invention, a laser beam combination apparatus is provided, comprising: a water cooling plate, a beam combiner and two laser arrays;

each of the laser arrays comprises N lasers, wherein N is a positive integer more than 1;

the two laser arrays are fixed on an upper surface and a lower surface of the water cooling plate, respectively;

the beam combiner performs a spatial beam combination, a polarization beam combination or a wavelength beam combination of laser beams output from the two laser arrays.

Optionally, the apparatus further comprises: two collimators corresponding to the two laser arrays, respectively;

each of the collimators is placed between a corresponding laser array and the beam combiner;

before the beam combiner performs a spatial beam combination, a polarization beam combination or a wavelength beam combination of laser beams output from the two laser arrays, each of the collimators collimates laser beams emitted by a corresponding laser array.

Optionally, the water cooling plate comprises: an upper layer plate, an intermediate layer plate and a lower layer plate;

the intermediate layer plate is provided with a water inflow channel and a water outflow channel such that cooling water flows in and out;

the upper layer plate is provided with a plurality of water cooling channels such that two ends of each of the water cooling channels in the upper layer plate are connected to the water inflow channel and the water outflow channel in the intermediate layer plate, respectively, when a lower surface of the upper layer plate is attached to an upper surface of the intermediate layer plate, the lower layer plate is provided with a plurality of water cooling channels such that two ends of each of the water cooling channels in the lower layer plate are connected to the water inflow channel and the water outflow channel in the intermediate layer plate, respectively, when an upper surface of the lower layer plate is attached to a lower surface of the intermediate layer plate;

the two laser arrays are fixed on an upper surface of the upper layer plate and a lower surface of the lower layer plate, respectively.

Optionally, the upper layer plate and the lower layer plate are fixed to the laser arrays, respectively, and then attached to the intermediate layer plate to form the water cooling plate;

wherein the two laser arrays are sintered onto the upper layer plate and the lower layer plate, respectively, through sintering processes of the same temperature, and the upper layer plate, the intermediate layer plate and the lower layer plate are fixed and connected through screws.

Optionally, the water cooling plate comprises: an upper layer plate and a lower layer plate;

a lower surface of the upper layer plate is provided with a plurality of grooves;

an upper surface of the lower layer plate is provided with a plurality of grooves;

the plurality of grooves in the lower surface of the upper layer plate are spliced with the plurality of grooves in the upper surface of the lower layer plate to form a plurality of water cooling channels, when the lower surface of the upper layer plate is attached to the upper surface of the lower layer plate;

the two laser arrays are fixed on an upper surface of the upper layer plate and a lower surface of the lower layer plate, respectively.

Optionally, the upper layer plate and the lower layer plate are welded to form the water cooling plate;

one of the laser arrays is sintered onto the upper layer plate through a sintering process of a higher temperature, and the other of the laser arrays is sintered onto the lower layer plate through a sintering process of a lower temperature;

or, one of the laser arrays is sintered onto the lower layer plate through a sintering process of a higher temperature, and the other of the laser arrays is sintered onto the upper layer plate through a sintering process of a lower temperature.

Optionally, the water cooling plate is molded through a 3D printing technique, and the water cooling plate has a water cooling channel inside;

one of the laser arrays is sintered onto the upper surface of the water cooling plate through a sintering process of a higher temperature, and the other of the laser arrays is sintered onto the lower surface of the water cooling plate through a sintering process of a lower temperature.

Optionally, each of the laser arrays comprises N diode laser emitters, or each of the laser arrays comprises N diode laser bars.

Optionally, the upper surface of the water cooling plate is a planar or stepped structure, and the lower surface of the water cooling plate is a planar or stepped structure;

the beam combiner comprises: one half wave plate and one lateral-displacement polarization beam splitting prism.

Optionally, when each of the laser arrays comprises N diode laser emitters, each of the collimators comprises: N fast axis collimation lenses and N slow axis collimation lenses corresponding to the N diode laser emitters;

each of the collimators comprises: N fast axis collimation lenses and one slow axis collimation lens corresponding to the N diode laser emitters; or each of the collimators comprises: N slow axis collimation lenses and one fast axis collimation lens corresponding to the N diode laser emitters.

It can be seen from the foregoing that, in the technical solution provided by the present invention, the lasers are arranged on both the upper and lower surfaces of the water cooling plate, and under the condition that a beam combination is performed on the same number of laser beams, the water cooling plate is used in a high efficiency to decrease the volume and weight of the laser beam combination apparatus, save the material of the water cooling plate of the laser beam combination apparatus, and reduce the cost of the laser beam combination apparatus, thus meeting the production and process requirement of the laser beam combination apparatus, and promoting the development and progress of the laser beam combination technique.

The above descriptions merely generalize the technical solution of the present invention, and in order to more clearly comprehend the technical means of the present invention to implement the invention with reference to the description and make the above and other objects, features and advantages of the present invention more obvious and readily understood, the specific embodiments of the present invention are given as follows.

BRIEF DESCRIPTION OF THE DRAWINGS

A person skilled in the art will be clear about other advantages and benefits by reading the detailed describes of the following preferred embodiments. The drawings only illustrate the preferred embodiments, rather than restricting the present invention. In addition, the same reference signs are used to denote the same parts throughout the drawings. In which.

DETAILED DESCRIPTION OF THE PREFERRED EMBODIMENTS

Next, the exemplary embodiments of the present disclosure will be described in more details with reference to the drawings. Although the drawings illustrate the exemplary embodiments of the present disclosure, it shall be understood that the present disclosure may be implemented in various forms, rather than being restricted by the embodiments described herein. On the other hand, these embodiments are provided to understood the present disclosure more thoroughly, and communicate the scope of the present disclosure to a person skilled in the art completely.

Axes x, y and z are established, wherein axis x is a horizontal axis, axis z is a longitudinal axis and axis y is a vertical axis to construct a right-hand space rectangular coordinate system x-y-z, based on which the laser beam combination apparatus provided by the present invention will be described. In the following embodiments, the vertical axis corresponds to a fast axis direction of a laser beam, and the horizontal axis corresponds to a slow axis direction of a laser beam.

Figure 1:
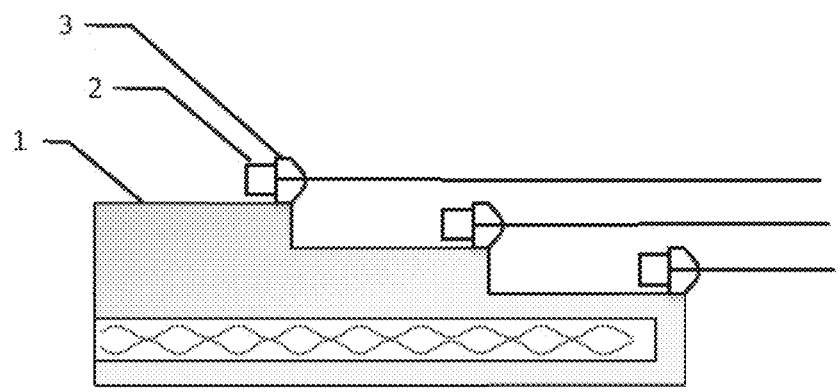
FIG. 1 is a schematic view of a laser beam combination apparatus in the prior art.
Figure 2:
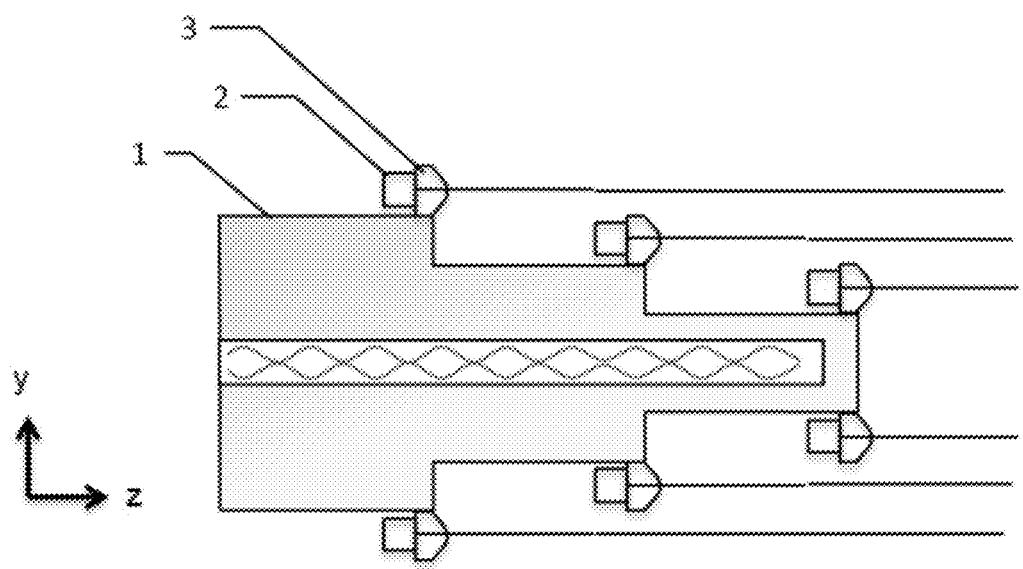
FIG. 2 is a schematic view of a laser beam combination apparatus according to Embodiment 1 of the present invention.

FIG. 2 is a schematic view of a laser beam combination apparatus according to Embodiment 1 of the present invention, and illustrates a schematic distribution of the laser beam combination apparatus on plane y-z. The apparatus comprises: two laser arrays, two collimators and one water cooling plate 1. As illustrated in FIG. 2, each of the laser arrays comprises three lasers 2, and each of the collimators corresponds to one of the laser arrays and includes three fast axis collimation lenses 3 (for collimating the divergence of laser beams in the fast axis direction) corresponding to the three lasers 2 in the laser array. In which, the two laser arrays are fixed at an upper surface and a lower surface of the water cooling plate 1, respectively; the upper surface and the lower surface of the water cooling plate 1 are stepped, and each step is fixed with one laser 2; in each of the laser arrays, the three lasers 2 are all diode laser emitters and distributed on plane y-z in a stepped manner. In this embodiment, a spatial beam combination of three laser beams output from the three lasers 2 is realized through the collimation of laser beams by the fast axis collimation lenses 3 and the spatial distribution of laser beams by the stepped structure of the upper surface/lower surface of the water cooling plate 1. Further, the laser beam combination apparatus also comprises a beam combiner (not illustrated) for performing a further beam combination process of six laser beams output from the two laser arrays. The beam combination process may be a spatial beam combination, a wavelength beam combination or a polarization beam combination, etc.

Figure 3A:
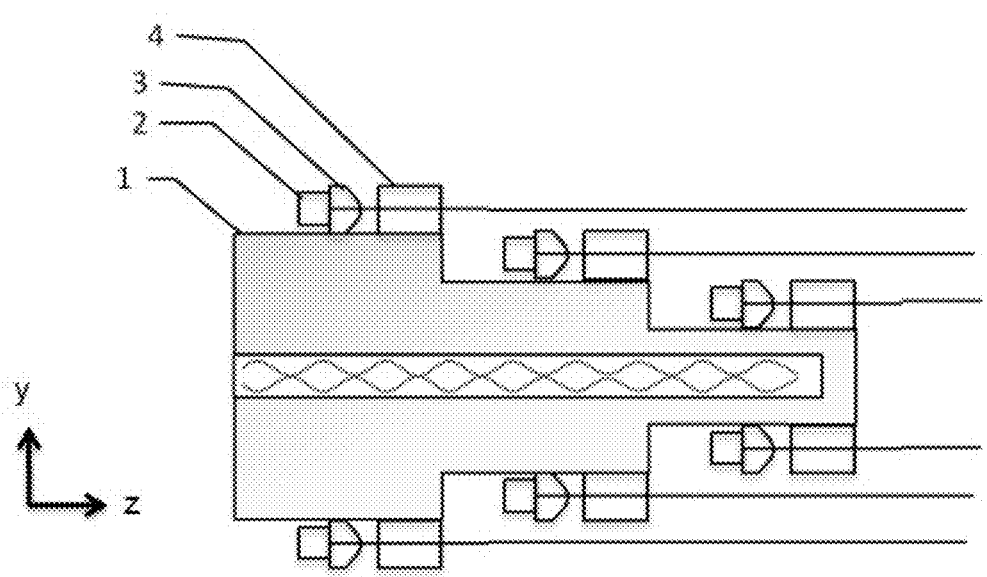
FIG. 3A is a schematic view of a laser beam combination apparatus according to Embodiment 2 of the present invention.

FIG. 3A is a schematic view of a laser beam combination apparatus according to Embodiment 2 of the present invention, and illustrates a schematic distribution of the laser beam combination apparatus on plane y-z. The apparatus comprises: two laser arrays, two collimators and one water cooling plate 1. As illustrated in FIG. 3A, each of the laser arrays comprises three lasers 2, and each of the collimators corresponds to one of the laser arrays and includes three fast axis collimation lenses 3 (for collimating the divergence of laser beams in the fast axis direction) and three slow axis collimation lenses 4 (for collimating the divergence of laser beams in the slow axis direction) corresponding to the three lasers 2 in the laser array. In which, the two laser arrays are fixed at an upper surface and a lower surface of the water cooling plate 1, respectively; the upper surface and the lower surface of the water cooling plate 1 are stepped, and each step is fixed with one laser 2; in each of the laser arrays, the three lasers 2 are all diode laser emitters and distributed on plane y-z in a stepped manner. In this embodiment, a spatial beam combination of three laser beams output from the three lasers 2 is realized in each of the laser arrays through the collimation of laser beams by the fast axis collimation lenses 3 and the slow axis collimation lenses 4, and the spatial distribution of laser beams by the stepped structure of the upper surface/lower surface of the water cooling plate 1. Further, the laser beam combination apparatus also comprises a beam combiner (not illustrated) for performing a further beam combination process of six laser beams output from the two laser arrays. The beam combination process may be a spatial beam combination, a wavelength beam combination or a polarization beam combination, etc., and the spatial beam combination is used herein.

Figure 3B:
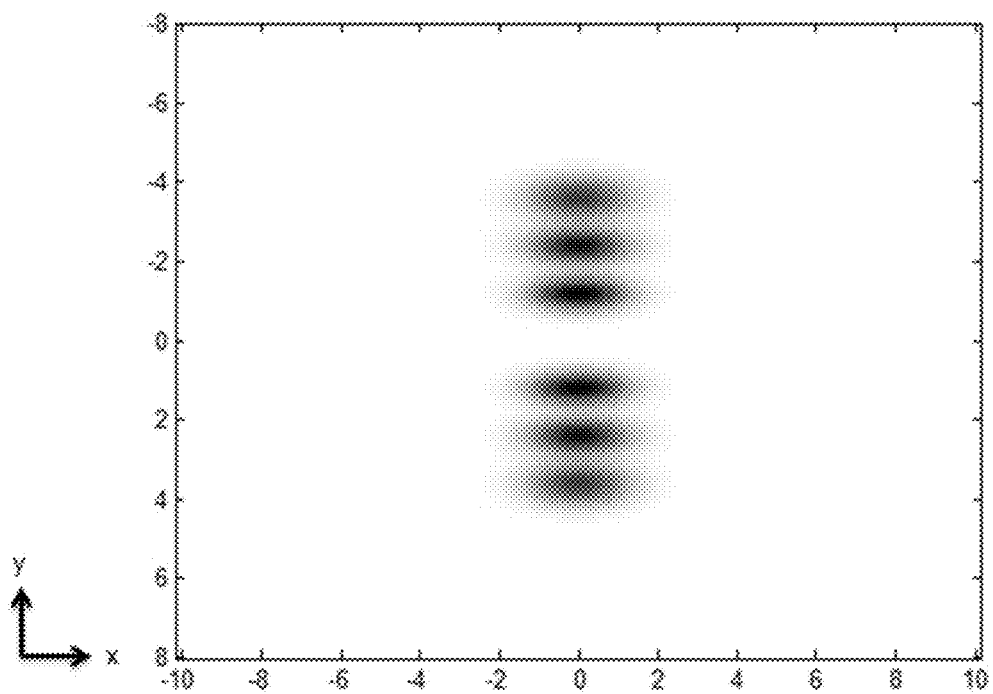
FIG. 3B is a schematic view of intensity distribution of a laser beam array output from the laser beam combination apparatus according to Embodiment 2 of the present invention.

FIG. 3B is a schematic view of intensity distribution of a laser beam array output from the laser beam combination apparatus according to Embodiment 2 of the present invention. As illustrated in FIG. 3B, the intensities of laser beams in the laser beam array obtained in this embodiment are all in Gaussian distributions. The upper three spots are formed by a spatial beam combination of laser beams emitted from the three lasers 2 on the upper surface of the water cooling plate 1, the lower three spots are formed by a spatial beam combination of laser beams emitted from the three lasers 2 on the lower surface of the water cooling plate 1, and the spots of the six laser beams are arranged in a column along the fast axis direction.

Correspondingly, in other embodiments, the spots of the laser beams output from the laser beam arrays may also be arranged in a column along the slow axis direction, which can be set upon actual demand and herein is not limited.

Thus it can be seen that, in the technical solution provided by the present invention, the lasers arranged on both the upper and lower surfaces of the water cooling plate, and under the condition that a beam combination is performed on the same number of laser beams, the water cooling plate is used in a high efficiency to decrease the volume and weight of the laser beam combination apparatus, save the material of the water cooling plate of the laser beam combination apparatus, and reduce the cost of the laser beam combination apparatus, thus meeting the production and process requirement of the laser beam combination apparatus, and promoting the development and progress of the laser beam combination technique.

In the embodiments of the present invention, the water cooling plate 1 in the laser beam combination apparatus may be embodied in the following manners.

Figure 4A:
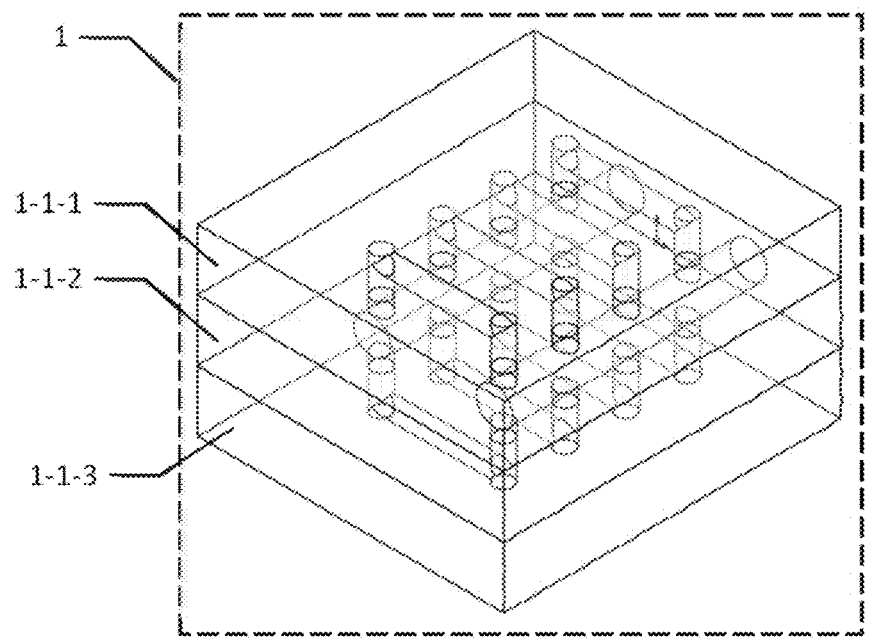
FIG. 4A is a perspective view of a water cooling plate according to an embodiment of the present invention.
Figure 4B:
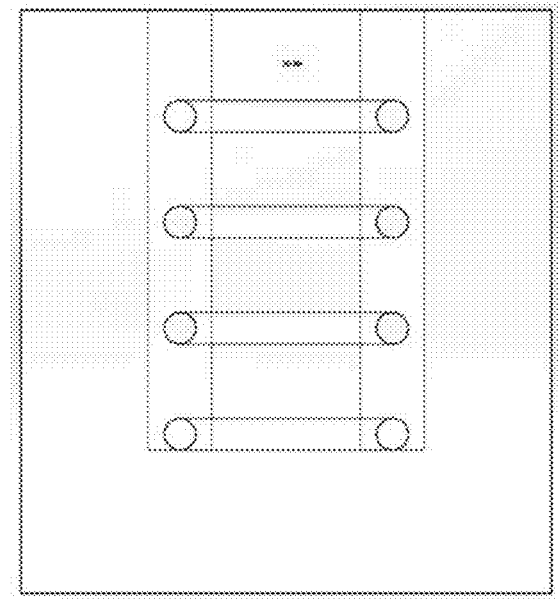
FIG. 4B is a top view of the water cooling plate according to the embodiment of the present invention.
Figure 4C:
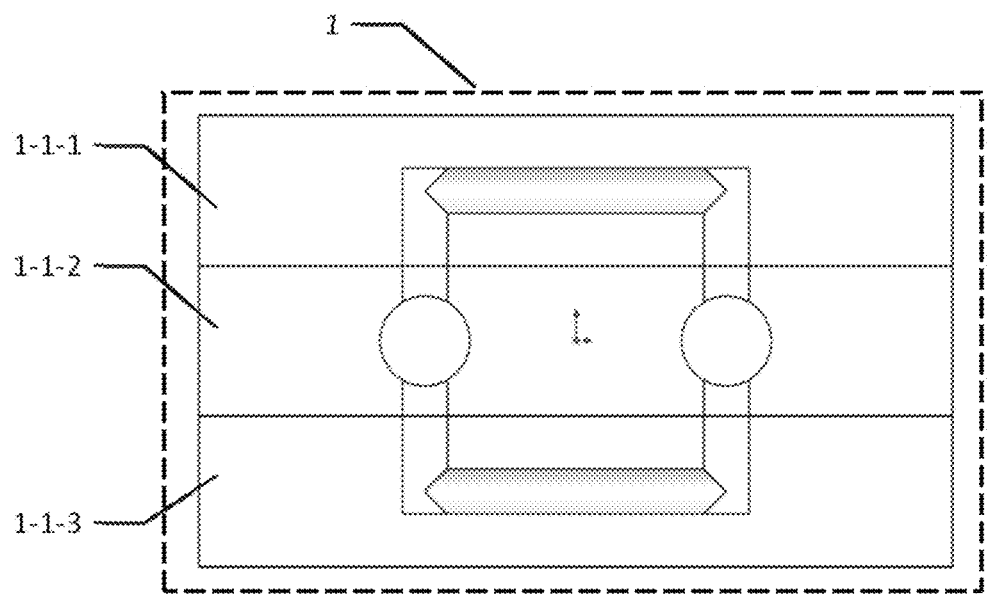
FIG. 4C is a front view of the water cooling plate according to the embodiment of the present invention.
Figure 4D:
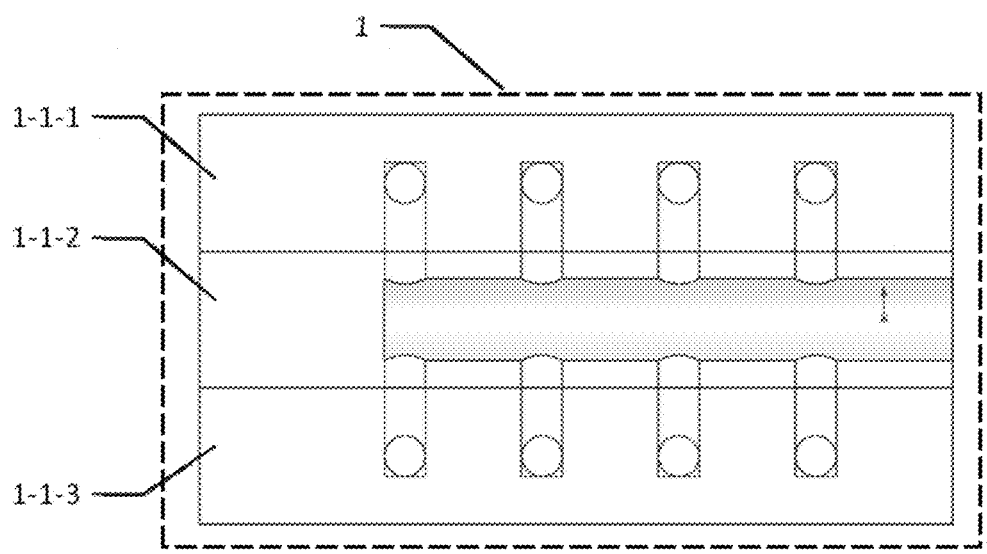
FIG. 4D is a side view of the water cooling plate according to the embodiment of the present invention.

Manner 1: referring to FIGS. 4A to 4D, wherein FIG. 4A is a perspective view of a water cooling plate according to an embodiment of the present invention; FIG. 4B is a top view of the water cooling plate according to the embodiment of the present invention; FIG. 4C is a front view of the water cooling plate according to the embodiment of the present invention; and FIG. 4D is a side view of the water cooling plate according to the embodiment of the present invention. As can be seen from those drawings, in this embodiment, the water cooling plate 1 comprises: an upper layer plate 1-1-1, an intermediate layer plate 1-1-2 and a lower layer plate 1-1-3. The intermediate layer plate 1-1-2 is provided with a water inflow channel and a water outflow channel such that the cooling water flows in and out. The upper layer plate 1-1-1 is provided with a plurality of water cooling channels such that two ends of each of the water cooling channels in the upper layer plate 1-1-1 are connected to the water inflow channel and the water outflow channel in the intermediate layer plate 1-1-2, respectively, when a lower surface of the upper layer plate 1-1-1 is attached to an upper surface of the intermediate layer plate 1-1-2. The lower layer plate 1-1-3 is provided with a plurality of water cooling channels such that two ends of each of the water cooling channels in the lower layer plate 1-1-3 are connected to the water inflow channel and the water outflow channel in the intermediate layer plate 1-1-2, respectively, when an upper surface of the lower layer plate 1-1-3 is attached to a lower surface of the intermediate layer plate 1-1-2.

The two laser arrays are fixed onto the upper surface of the upper layer plate 1-1-1 and the lower surface of the lower layer plate 1-1-3, respectively. During the specific implementation, the upper layer plate 1-1-1 and the lower layer plate 1-1-3 are fixed to the laser arrays, respectively, and then attached to the intermediate layer plate 1-1-2 to form the water cooling plate 1, wherein the two laser arrays are sintered on the upper layer plate 1-1-1 and the lower layer plate 1-1-3, respectively, through sintering processes of the same temperature, and the upper layer plate 1-1-1, the intermediate layer plate 1-1-2 and the lower layer plate 1-1-3 are fixed and connected through screws.

Figure 5A:
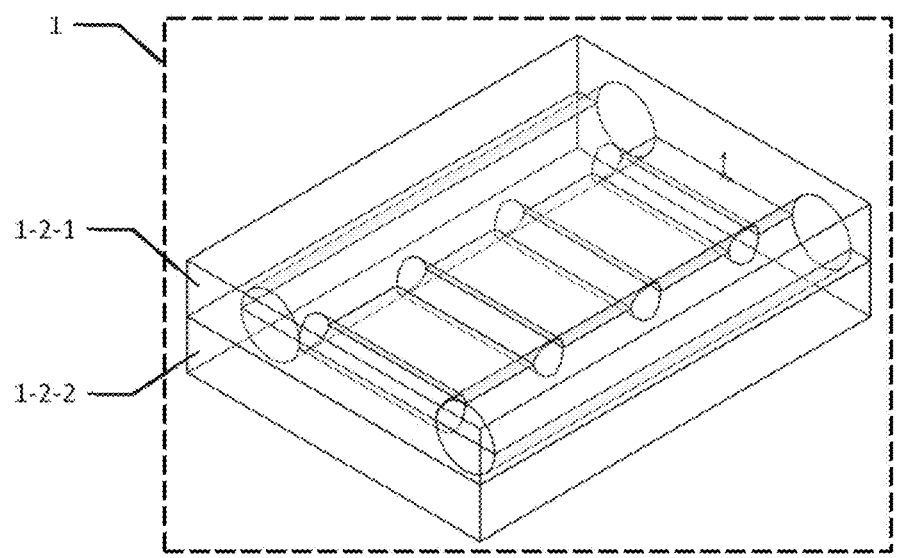
FIG. 5A is a perspective view of a water cooling plate according to another embodiment of the present invention.
Figure 5B:
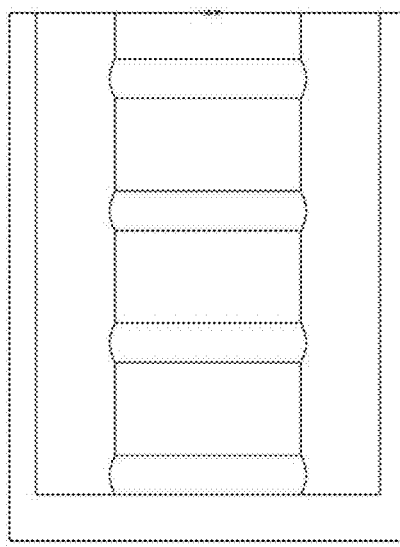
FIG. 5B is a top view of the water cooling plate according to the another embodiment of the present invention.
Figure 5C:
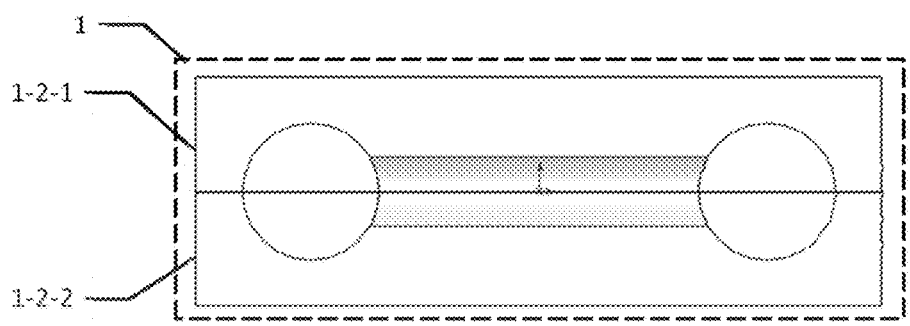
FIG. 5C is a front view of the water cooling plate according to the another embodiment of the present invention.
Figure 5D:
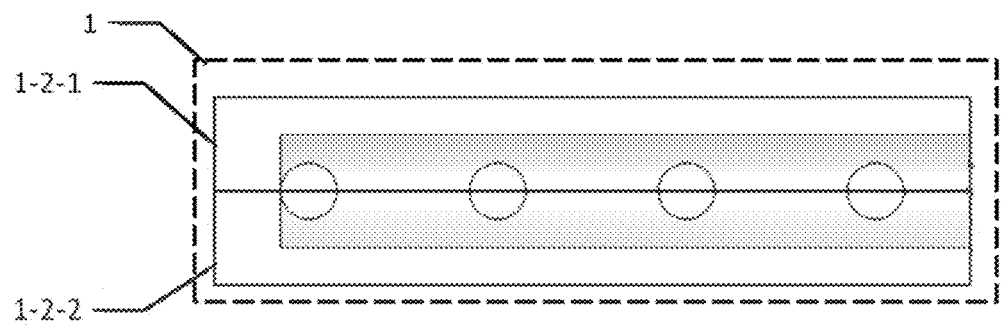
FIG. 5D is a side view of the water cooling plate according to the another embodiment of the present invention.

Manner 2: referring to FIGS. 5A to 5D, wherein FIG. 5A is a perspective view of a water cooling plate according to another embodiment of the present invention; FIG. 5B is a top view of the water cooling plate according to the another embodiment of the present invention; FIG. 5C is a front view of the water cooling plate according to the another embodiment of the present invention; and FIG. 5D is a side view of the water cooling plate according to the another embodiment of the present invention. As can be seen from those drawings, in this embodiment, the water cooling plate 1 comprises: an upper layer plate 1-2-1 and a lower layer plate 1-2-2. A lower surface of the upper layer plate 1-2-1 is provided with a plurality of grooves, and an upper surface of the lower layer plate 1-2-2 is provided with a plurality of grooves, wherein the plurality of grooves on the lower surface of the upper layer plate 1-2-1 are spliced with the plurality of grooves on the upper surface of the lower layer plate 1-2-2 to form a plurality of water cooling channels, when the lower surface of the upper layer plate 1-2-1 is attached to the upper surface of the lower layer plate 1-2-2.

The two laser arrays are fixed on an upper surface of the upper layer plate 1-2-1 and a lower surface of the lower layer plate 1-2-2, respectively. In the specific implementation, the upper layer plate 1-2-1 and the lower layer plate 1-2-2 are welded to form the water cooling plate 1 at first, then one of the laser arrays is sintered on the upper layer plate 1-2-1 through a sintering process of a higher temperature, and the other of the laser arrays is sintered on the lower layer plate 1-2-2 through a sintering process of a lower temperature; or one of the laser arrays is sintered on the lower layer plate 1-2-2 through a sintering process of a higher temperature, and the other of the laser arrays is sintered on the upper layer plate 1-2-1 through a sintering process of a lower temperature.

Figure 6A:
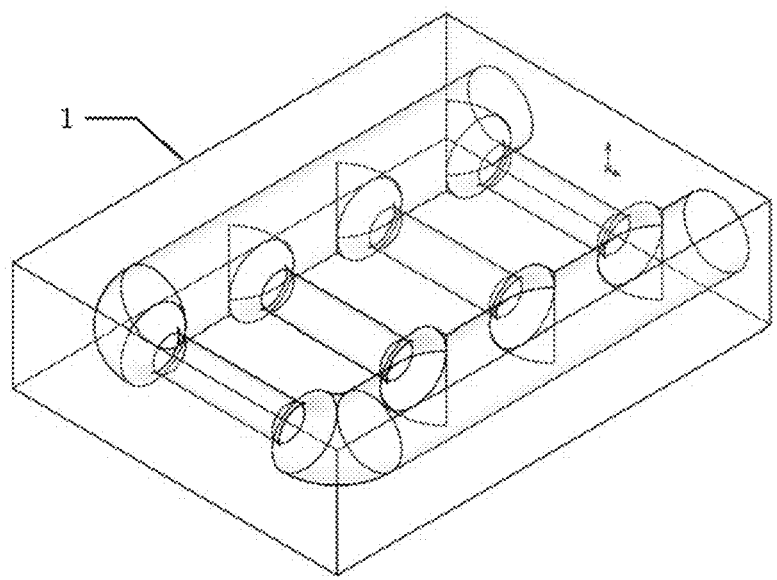
FIG. 6A is a perspective view of a water cooling plate according to still another embodiment of the present invention.
Figure 6B:
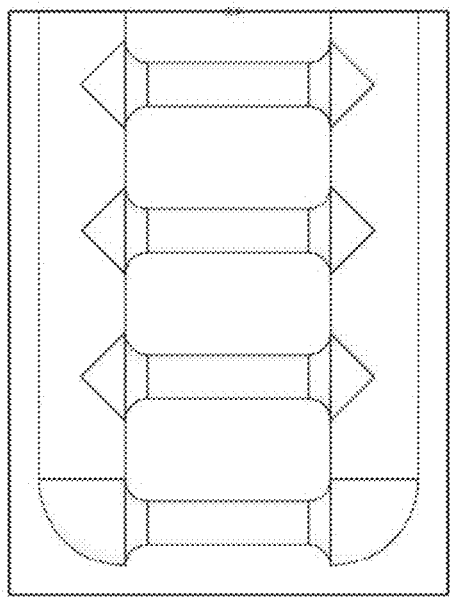
FIG. 6B is a top view of the water cooling plate according to the still another embodiment of the present invention.
Figure 6C:
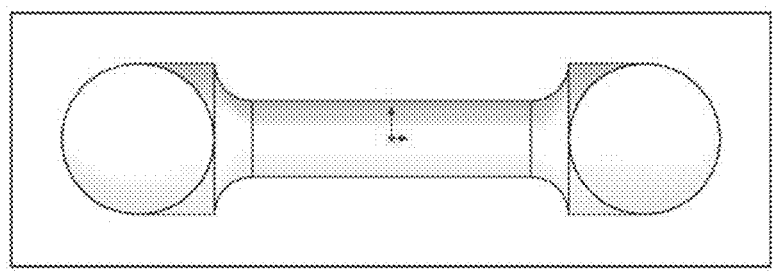
FIG. 6C is a front view of the water cooling plate according to the still another embodiment of the present invention.
Figure 6D:
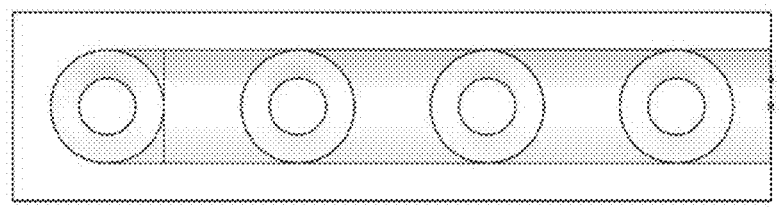
FIG. 6D is a side view of the water cooling plate according to the still another embodiment of the present invention.

Manner 3: referring to FIGS. 6A to 6D, wherein FIG. 6A is a perspective view of a water cooling plate according to still another embodiment of the present invention; FIG. 6B is a top view of the water cooling plate according to the still another embodiment of the present invention; FIG. 6C is a front view of the water cooling plate according to the still another embodiment of the present invention; and FIG. 6D is a side view of the water cooling plate according to the still another embodiment of the present invention. In this embodiment, the water cooling plate 1 is molded through a 3D printing technique, and the water cooling plate 1 has a water cooling channel inside. One of the laser arrays is sintered onto the upper surface of the water cooling plate 1 through a sintering process of a higher temperature, and the other of the laser arrays is sintered onto the lower surface of the water cooling plate 1 through a sintering process of a lower temperature.

Thus it can be seen that the specific manner for processing the water cooling plate 1 with both surfaces available in the laser beam combination apparatus provided by the present invention may be selected flexibly upon actual demand, and the specific manner for fixing the laser arrays on the surfaces of the water cooling plate 1 may be correspondingly selected.

Figure 7A:
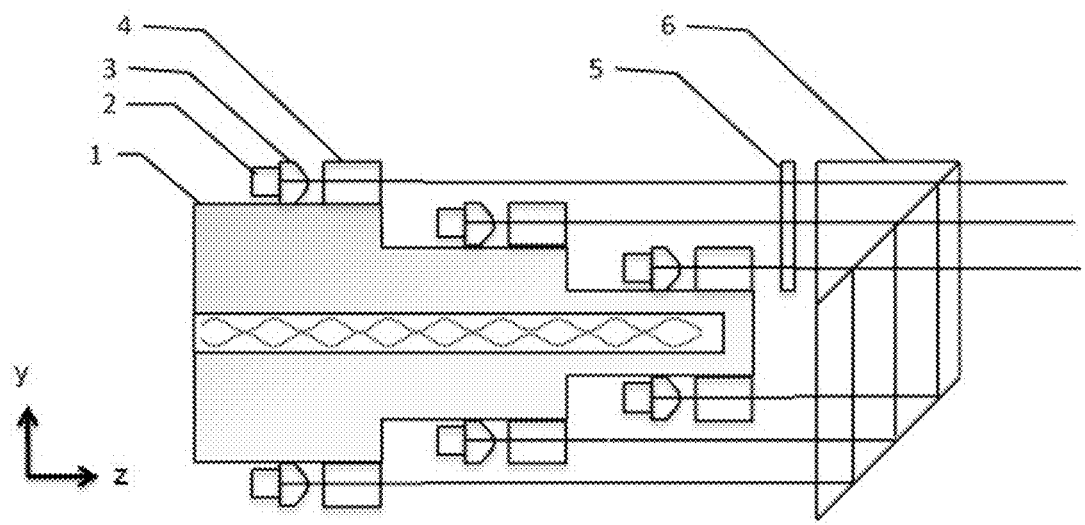
FIG. 7A is a schematic view of a laser beam combination apparatus according to Embodiment 3 of the present invention.

FIG. 7A is a schematic view of a laser beam combination apparatus according to Embodiment 3 of the present invention, and illustrates a schematic distribution of the laser beam combination apparatus on plane y-z. The apparatus comprises: two laser arrays, two collimators, one water cooling plate 1, one half wavelength plate 5 and one lateral-displacement polarization beam splitting prism 6. As illustrated in FIG. 7A, each of the laser arrays comprises three lasers 2, and each of the collimators corresponds to one of the laser arrays and includes three fast axis collimation lenses 3 (for collimating the divergence of laser beams in the fast axis direction) and three slow axis collimation lenses 4 (for collimating the divergence of laser beams in the slow axis direction) corresponding to the three lasers 2 in the laser array. In which, the two laser arrays are fixed at an upper surface and a lower surface of the water cooling plate 1, respectively; the upper surface and the lower surface of the water cooling plate 1 are stepped, and each step is fixed with one laser 2; in each of the laser arrays, the three lasers 2 are all diode laser emitters and distributed on plane y-z in a stepped manner. In this embodiment, spatial beam combination of three laser beams output from the three lasers 2 in each of the laser arrays is realized through the collimation of laser beams by the fast axis collimation lenses 3 and the slow axis collimation lenses 4, and the spatial distribution of laser beams by the stepped structure of the upper surface/lower surface of the water cooling plate 1. Further, the half wave plate 5 and the lateral-displacement polarization beam splitting prism 6 perform a further beam combination of six laser beams output from the two laser arrays. Specifically, the three laser beams emitted from the three lasers 2 on the lower surface of the water cooling plate 1 are reflected by the lateral-displacement polarization beam splitting prism 6 onto a polarization beam splitting plane of the lateral-displacement polarization beam splitting prism 6 and reflected on the polarization beam splitting plane, while the three laser beams emitted from the three lasers 2 on the upper surface of the water cooling plate 1 have the polarization direction changed after passing through the half wave plate 5, and then transmitted through the polarization beam splitting plane of the lateral-displacement polarization beam splitting prism 6 such that paths of the laser beams emitted from the two laser arrays on the upper and lower surfaces of the water cooling plate 1 coincide with each other to output three laser beams.

Figure 7B:
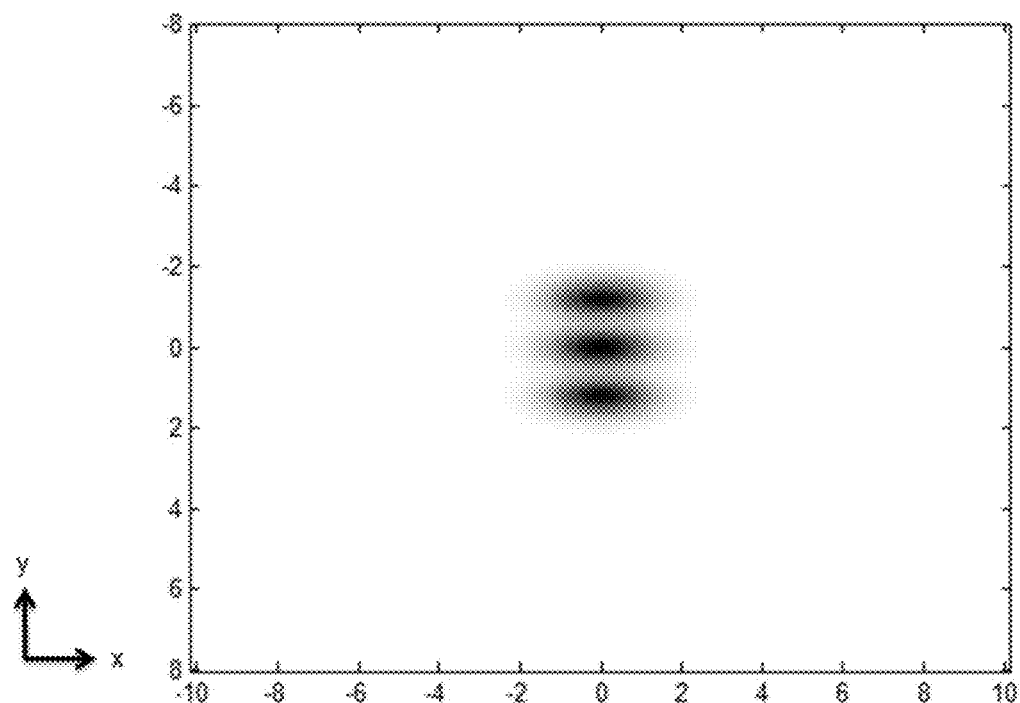
FIG. 7B is a schematic view of intensity distribution of a laser beam array output from the laser beam combination apparatus according to Embodiment 3 of the present invention.

FIG. 7B illustrates a schematic view of intensity distribution of a laser beam array output from the laser beam combination apparatus according to Embodiment 3 of the present invention. As illustrated in FIG. 7B, the intensities of laser beams in the laser beam array obtained in this embodiment are all in Gaussian distributions. The six laser beams emitted from the six lasers 2 on the upper and lower surfaces of the water cooling plate 1 are combined into three laser beams through the half wave plate 5 and the lateral-displacement polarization beam splitting prism 6, thus forming three corresponding spots arranged in a column along the fast axis direction.

Correspondingly, in other embodiments, the spots of the laser beams in the output laser beam arrays may also be arranged in a column along the slow axis direction, which can be set upon actual demand and herein is not limited.

In the embodiments of the present invention, each of the laser arrays may further comprise N semiconductor laser bars.

In the embodiments of the present invention, after the position of plane where the output laser beam array locates is determined, the fast axis collimation lens 2 and the slow axis collimation lens 3 in the collimator may be used flexibly. When each of the laser arrays comprises N diode laser emitters, each of the collimators may comprise: N fast axis collimation lenses and N slow axis collimation lenses corresponding to the N diode laser emitters; each of the collimators may comprise: N fast axis collimation lenses and one slow axis collimation lens corresponding to the N diode laser emitters; or each of the collimators may comprise: N slow axis collimation lenses and one fast axis collimation lens corresponding to the N diode laser emitters.

In other embodiments, a plurality of laser beam arrays output from the spatial beam combination apparatus as described in any of Embodiments 1 to 3 may be further processed in a manner of polarization beam combination or wavelength beam combination, etc., wherein the manner of wavelength beam combination comprises dense wavelength division multiplexing, wideband wavelength division multiplexing, etc.

In conclusion, in the technical solution provided by the present invention, the lasers are arranged on the upper and lower surfaces of the water cooling plate, and under the condition that a beam combination is performed on the same number of laser beams, the water cooling plate is used in a high efficiency to decrease the volume and weight of the laser beam combination apparatus, save the material of the water cooling plate of the laser beam combination apparatus, and reduce the cost of the laser beam combination apparatus, make it easy to increase the number of lasers in the laser array and the high power obtained after the laser beam combination meet the application requirement, thus meeting the production and process requirement of the laser beam combination apparatus, promoting the development and progress of the laser beam combination technique, and then meeting the space beam combination requirement.

The above descriptions are merely preferred embodiments of the present invention, rather than restrictions to the protection scope of the present invention. Any amendment, equivalent replacement, improvement, etc. made within the spirit and principle of the present invention shall fall within the protection scope of the present invention.

The invention claimed is:

1. A laser beam combination apparatus, comprising:
  a water cooling plate, a beam combiner, and two laser arrays;
  wherein each of the laser arrays comprises N lasers, N is a positive integer greater than 1;
  wherein the two laser arrays are fixed on an upper surface and a lower surface of the water cooling plate, respectively; and
  wherein the beam combiner performs a spatial beam combination, a polarization beam combination, or a wavelength beam combination of laser beams output from the two laser arrays;
  wherein the water cooling plate comprises: an upper layer plate and a lower layer plate;
  wherein a lower surface of the upper layer plate is provided with a plurality of grooves;
  wherein an upper surface of the lower layer plate is provided with a plurality of grooves;
  wherein the plurality of grooves in the lower surface of the upper layer plate are spliced with the plurality of grooves in the upper surface of the lower layer plate to form a plurality of water cooling channels, when the lower surface of the upper layer plate is attached to the upper surface of the lower layer plate; and
    wherein the two laser arrays are fixed on an upper surface of the upper layer plate and a lower surface of the lower layer plate, respectively;
    wherein the upper surface of the water cooling plate is a planar or stepped structure, and the lower surface of the water cooling plate is a planar or stepped structure; and
    wherein the beam combiner comprises: one half wave plate and one lateral-displacement polarization beam splitting prism.

2. The apparatus according to claim 1, further comprising: two collimators corresponding respectively to the two laser arrays,
    wherein each of the collimators is disposed between a corresponding laser array and the beam combiner;
    wherein before the beam combiner performs a spatial beam combination, a polarization beam combination or a wavelength beam combination of laser beams output from the two laser arrays; and
    wherein each of the collimators collimates laser beams emitted by a corresponding laser array.

3. The apparatus according to claim 1, wherein the water cooling plate comprises: an upper layer plate, an intermediate layer plate, and a lower layer plate;
  wherein the intermediate layer plate comprises a water inflow channel and a water outflow channel such that cooling water flows in and out;
  wherein the upper layer plate comprises a plurality of water cooling channels such that two ends of each of the water cooling channels in the upper layer plate are connected to the water inflow channel and the water outflow channel in the intermediate layer plate, respectively, when a lower surface of the upper layer plate is attached to an upper surface of the intermediate layer plate;
  wherein the lower layer plate comprises a plurality of water cooling channels such that two ends of each of the water cooling channels in the lower layer plate are connected to the water inflow channel and the water outflow channel in the intermediate layer plate, respectively, when an upper surface of the lower layer plate is attached to a lower surface of the intermediate layer plate; and
  wherein the two laser arrays are fixed on an upper surface of the upper layer plate and a lower surface of the lower layer plate, respectively.

4. The apparatus according to claim 3,
  wherein the upper layer plate and the lower layer plate are fixed to the laser arrays, respectively, and then attached to the intermediate layer plate to form the water cooling plate; and
  wherein the two laser arrays are sintered onto the upper layer plate and the lower layer plate, respectively, through sintering processes of the same temperature, and the upper layer plate, the intermediate layer plate and the lower layer plate are fixed and connected through screws.

5. The apparatus according to claim 1, wherein the upper layer plate and the lower layer plate are welded as the water cooling plate;
  one of the laser arrays is sintered onto the upper layer plate through a sintering process of a higher temperature, and the other of the laser arrays is sintered onto the lower layer plate through a sintering process of a lower temperature;
  or,
  one of the laser arrays is sintered onto the lower layer plate through a sintering process of a higher temperature, and the other of the laser arrays is sintered onto the upper layer plate through a sintering process of a lower temperature.

6. The apparatus according to claim 1,
  wherein the water cooling plate is molded through a 3D printing technique, and the water cooling plate has a water cooling channel inside; and
  wherein one of the laser arrays is sintered onto the upper surface of the water cooling plate through a sintering process of a higher temperature, and the other of the laser arrays is sintered onto the lower surface of the water cooling plate through a sintering process of a lower temperature.

7. The apparatus according to claim 1, wherein,
  each laser array comprises N diode laser emitters, or each laser array comprises N diode laser bars.

8. The apparatus according to claim 7, wherein when each of the laser arrays comprises N diode laser emitters,
  wherein each of the collimators comprises: N fast axis collimation lenses and N slow axis collimation lenses corresponding to the N diode laser emitters.

9. The apparatus according to claim 7, wherein when each of the laser arrays comprises N diode laser emitters, wherein each of the collimators comprises: N fast axis collimation lenses and one slow axis collimation lens corresponding to the N diode laser emitters.

10. The apparatus according to claim 7, wherein when each of the laser arrays comprises N diode laser emitters, wherein each of the collimators comprises: N slow axis collimation lenses and one fast axis collimation lens corresponding to the N diode laser emitters.

* * * * *